(12) United States Patent
Ting et al.

(10) Patent No.: US 7,275,964 B2
(45) Date of Patent: Oct. 2, 2007

(54) ELECTRICAL CARD CONNECTOR

(75) Inventors: Chien-Jen Ting, Tu-Cheng (TW); Yung-Chang Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/414,788

(22) Filed: May 1, 2006

(65) Prior Publication Data
US 2006/0246782 A1 Nov. 2, 2006

(30) Foreign Application Priority Data
Apr. 29, 2005 (TW) ............................... 94206876 U

(51) Int. Cl.
H01R 24/00 (2006.01)
(52) U.S. Cl. ..................................... 439/630
(58) Field of Classification Search ................ 439/630, 439/159, 95
See application file for complete search history.

(56) References Cited

U.S. PATENT DOCUMENTS 6,332,791 B1 * 12/2001 Wang et al. ................ 439/159
6,475,005 B2 * 11/2002 Yu ............................. 439/157
6,648,694 B2 * 11/2003 Takamori et al. ........... 439/630
6,655,973 B2 * 12/2003 Ji et al. ...................... 439/159
6,811,443 B2 * 11/2004 Machihara et al. ......... 439/630
6,988,904 B1 * 1/2006 Lai ............................. 439/159
7,029,299 B1 * 4/2006 Chen .......................... 439/159
7,083,473 B1 * 8/2006 Lai ............................. 439/630
2002/0102882 A1 * 8/2002 Tanaka ....................... 439/630
2003/0064627 A1 * 4/2003 Ooya et al. ................. 439/630
2005/0106944 A1 * 5/2005 Kuo ........................... 439/630
2005/0272283 A1 * 12/2005 Chang ........................ 439/92
2005/0277333 A1 * 12/2005 Kuo ........................... 439/607
2005/0287870 A1 * 12/2005 Kuo ........................... 439/630

* cited by examiner

Primary Examiner—Chandrika Prasad
Assistant Examiner—Harshad C Patel
(74) Attorney, Agent, or Firm—Wei Te Chung

(57) ABSTRACT

A card connector for accommodating cards comprising an insulating housing defining a plurality of groove, a plurality of contacts received in the grooves and a shell defining a card receiving space for the cards together with the insulating housing. Each contact has a contacting portion for contacting with the cards. The shell comprises a top plate and a bottom plate respectively faced to a top and a bottom surface of the insulating housing and is formed with a plurality of springs to abut against the card.

20 Claims, 6 Drawing Sheets

ELECTRICAL CARD CONNECTOR

BACKGROUND OF THE INVENTION

1. Field of the Invention

The present invention is generally related to a card connector for connecting an electrical card with an electrical equipment and with an anti-EMI equipment.

2. Description of Related Art

To adapt to the development of communication and digital techniques, electrical cards are widely used in varied electrical equipments for saving information, and card connectors are used for connecting electrical cards with electrical equipments. Usually, EMI (Electro Magnetic Interference) will occur when electrical cards conduct with electrical equipments, and that will influence a transmission quality between the card and the electrical equipments. So a card connector is commonly provided with metal pieces electrically contacting with grounding pads on the circuit board assembled the card connector and the card to solve the above problem.

U.S. Pat. No. 6,669,494 discloses a card connector assembled on a circuit board, the card connector defines an inserting port for a card and comprises an insulating housing and a metal shell covering the insulating housing and grounding to the circuit board. The metal shell is formed with a top plate and two opposed sidewall bent from opposed lateral sides of the top plate and each formed with an elastic slice near the inserting port. The elastic slices electrically contact with the inserted card to ground the interferential electromagnetic signals on the card.

U.S. Patent application No. 2002/0102882 discloses another card connector comprising an insulating housing and a metal shell covering the insulating housing. Three slices for anti-EMI are formed on a top surface of the metal shell and arranged in a triangular type to contact with and press the card inserted into the card connector. However, when the card connector needs to engage with different card in different size, such as different width, the slices can not press the card evenly, which will cause the card to slant in the card connector and influence the transmission quality of signals between the card and the electrical equipment.

Hence, an card connector is required to overcome the disadvantages of the related art.

SUMMARY OF THE INVENTION

Accordingly, an object of the present invention is to provide a card connector, which has an anti-EMI equipment and can ensure that a card insert into the card connector smoothly.

To achieve the above objects, a card connector in accordance with the present invention comprises an insulating housing formed with a plurality of grooves, a plurality of contacts respectively received in the grooves of the insulating housing, a shell defining a L-shaped card receiving space for a card together with the insulating housing. Each contact has a contacting portion for contacting with the card. The shell comprises a top plate and a bottom plate respectively faced to a top and a bottom surface of the insulating housing, and the bottom plate is formed with a plurality of springs to abut against the card.

Other objects, advantages and novel features of the present invention will be drawn from the following detailed description of a preferred embodiment of the present invention with attached drawings:

DETAILED DESCRIPTION OF THE INVENTION

Reference will now be made in detail to the preferred embodiment of the present invention.

Figure 1:
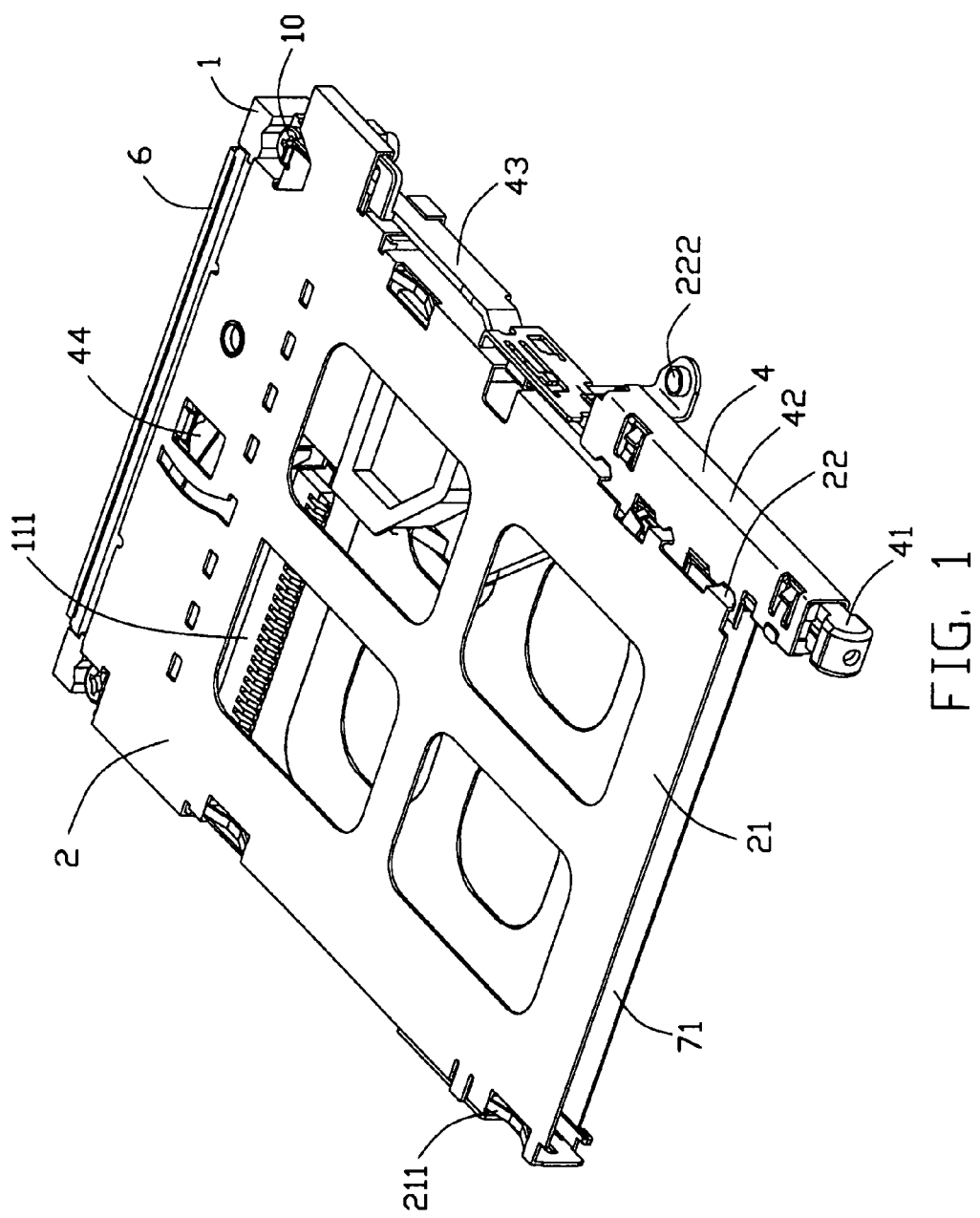
FIG. 1 is a perspective view of a card connector in accordance with the present invention.
Figure 2:
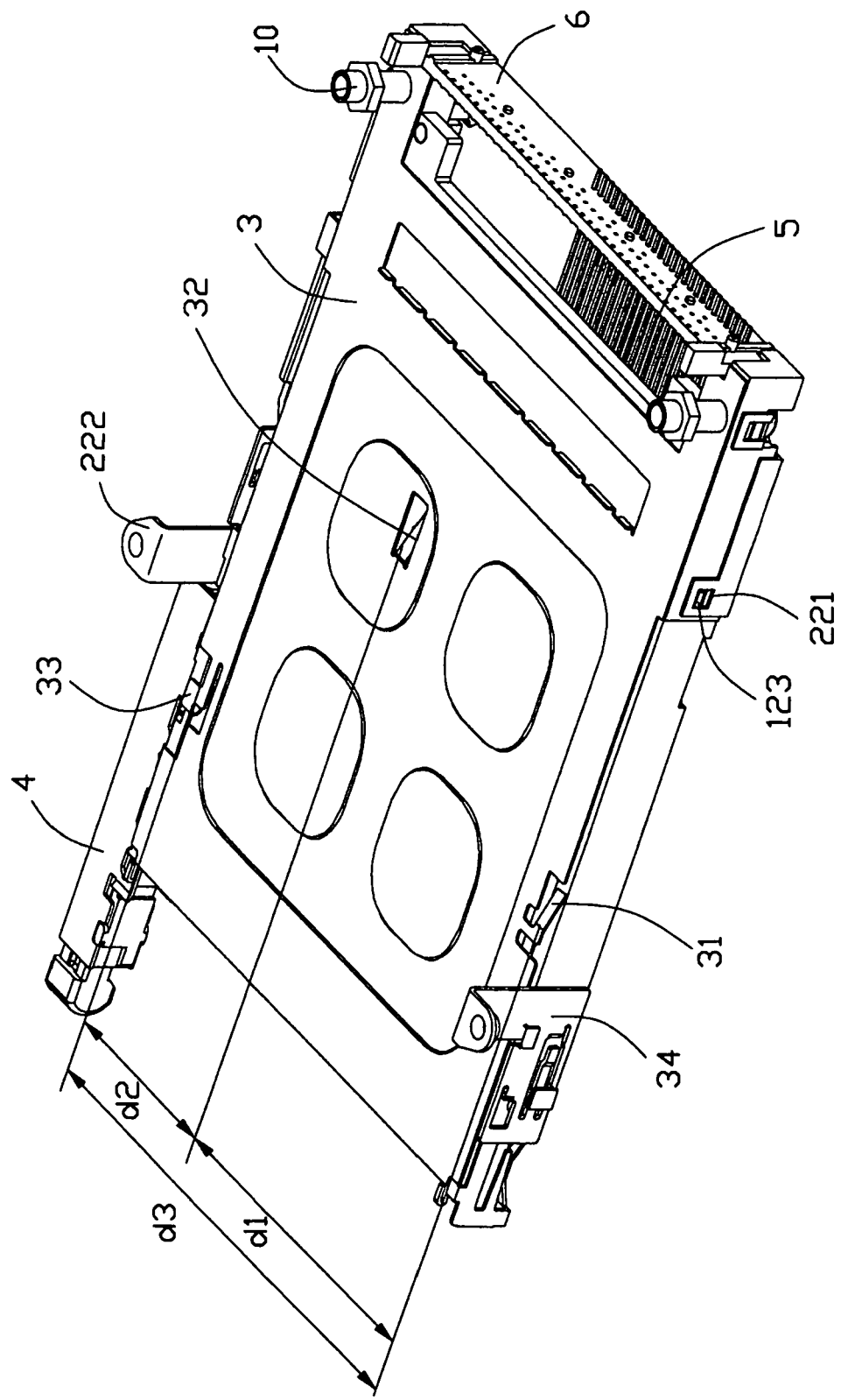
FIG. 2 is similar with the card connector shown in FIG. 1, taken from another aspect.
Figure 3:
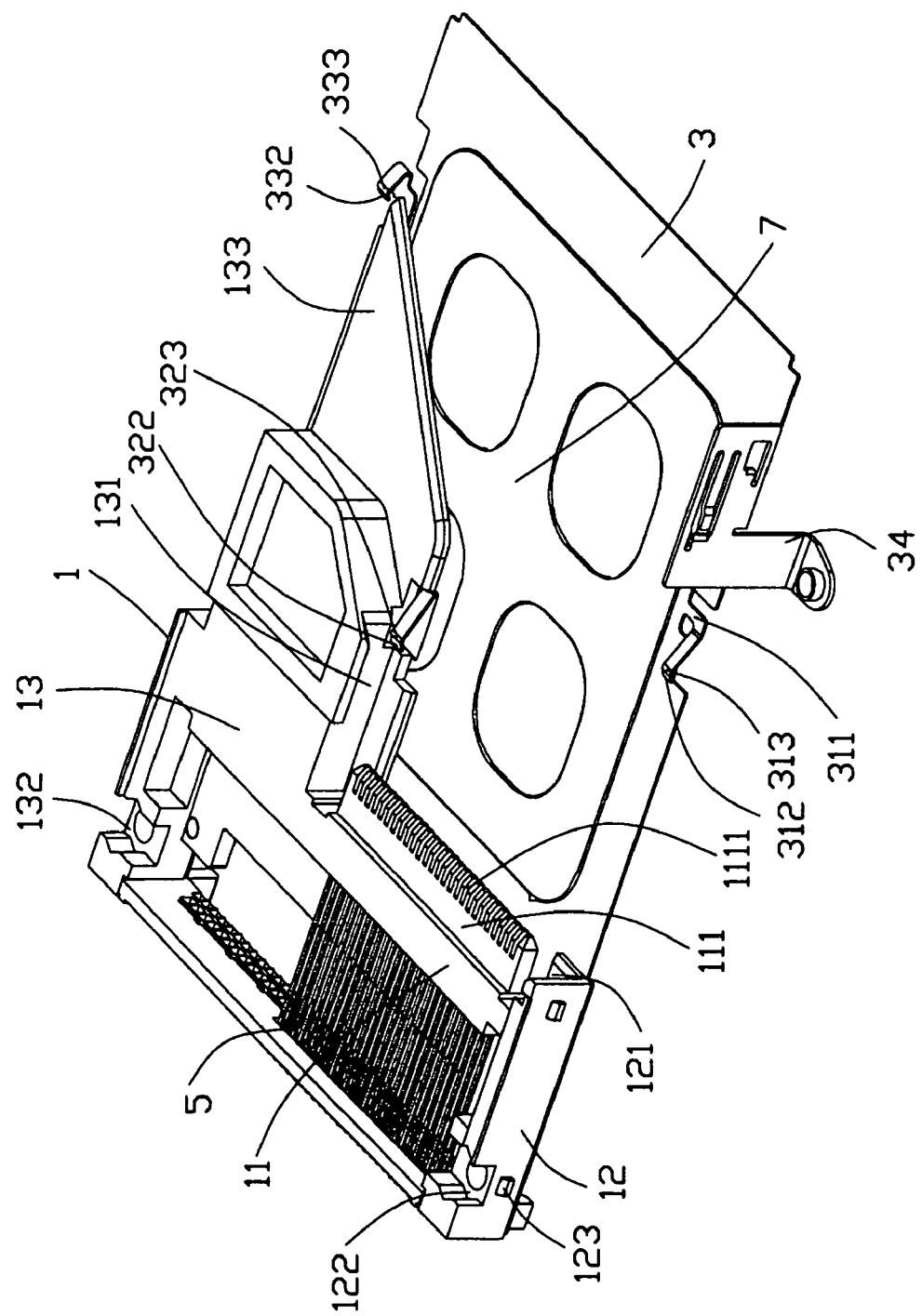
FIG. 3 is an perspective view of the insulating housing of the card connector, with the contacts and the spacer assembled on the insulating housing.

Referring to FIG. 1-3, the card connector in accordance with the present invention is able to engaging with a first card 8 and a second card 9 and comprises an insulating housing 1, a shell having a top plate 2 and a bottom plate 3, respectively faced to a top surface and a bottom surface of the insulating housing 1, an ejector 4, a plurality of contacts 5 received in the insulating housing 1 and a spacer 6 for retaining the contacts 5. The shell and the insulating housing 1 define a card receiving space 7 with a card insertion direction together, and the ejector 4 is assembled to a side of the insulating housing 1 and the top plate 2 of the shell.

Figure 4:
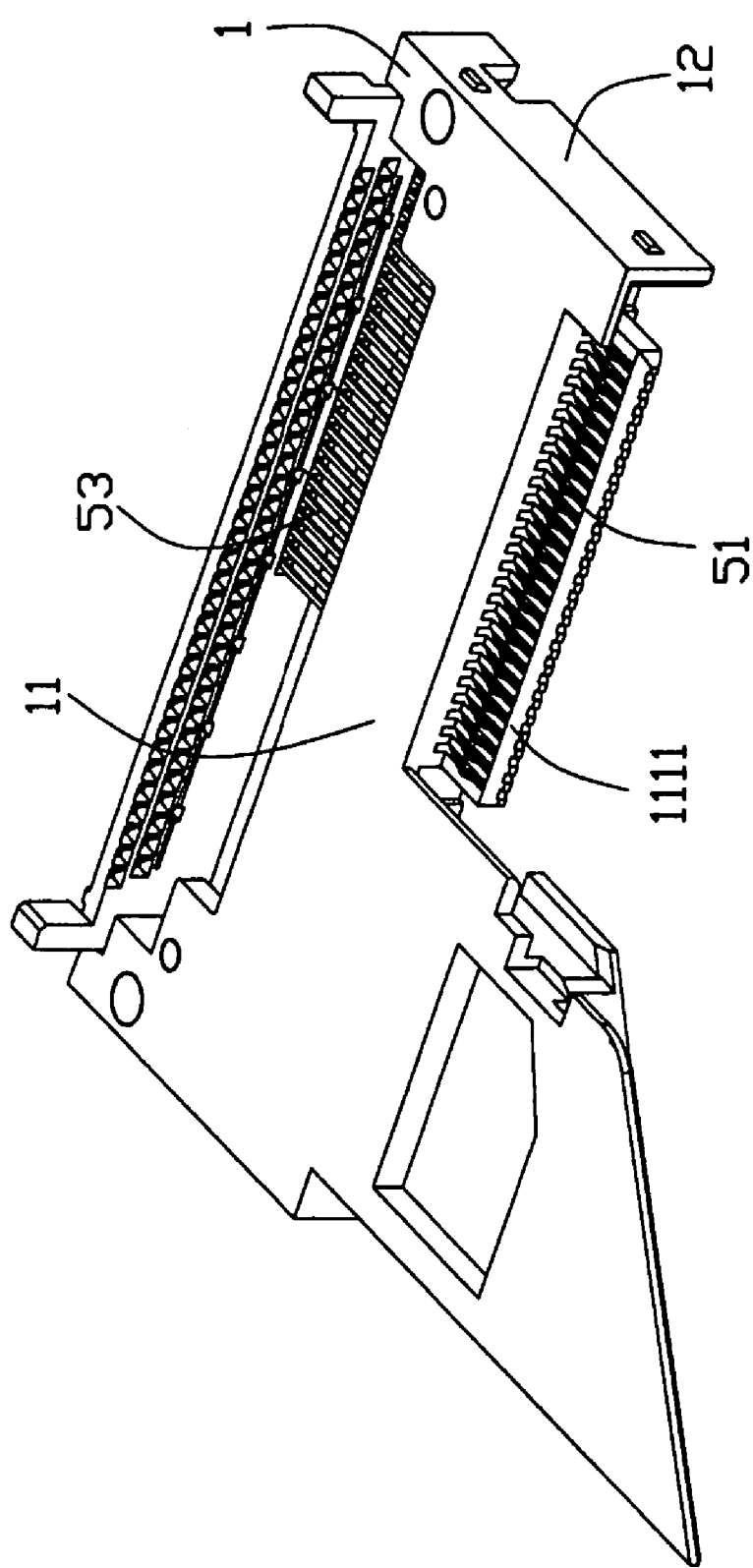
FIG. 4 is another assembled, perspective view of a card connector in accordance with the present invention, wherein the shell is not assembled to the insulating housing.

Referring to FIG. 3 and FIG. 4, the insulating housing 1 comprise a base 11 and two opposed supporting arm 12, 13 integral with the base 11 and on opposed lateral ends of the base 11. A mating portion 111 extends forwardly from the base 11 and is parallel with and between the supporting arms 12, 13. The mating portion 111 is formed with a plurality of grooves 1111 through the insulating housing 1 for receiving the contacts 5. The supporting arm 12 defines a guiding channel 121 in an inner side near the mating portion 111 for guiding the cards 8, 9 and a recess 122 with a trough hole (not labeled) used for a bolt 10 through to retain the top plate 2 and bottom plate 3 to the insulating housing 1 on a rear end thereof, and the supporting arm 12 is formed with two latching block 123 for engaging with the top plate 2. The supporting arm 13 has similar a guiding channel 131 and a recess 132 as the guiding channel 121 and the recess 122 of the supporting arm 12. The supporting arm 13 has a triangular supporting board 133 extending forwardly toward the card receiving space 7 from a bottom edge thereof to abut the bottom plate 3.

Referring to FIG. 1-3, the top plate 2 and the bottom plate 3 of the shell are rectangular shaped and sandwich the insulating housing 1, together. Since the supporting arm 13 of the insulating housing 1 protrudes forwardly from a side of the base 11, the card receiving space 7 for the cards defined by the shell and the insulating housing 1 is in a L-shape. The top plate 2 of the shell covering the insulating housing 1 comprises a top face 21 and two opposed sidewall 22 on lateral sides of the top face 21. The top face 21 is provided with a plurality of slice 211 on two lateral edges respectively near the sidewalls 22 for guiding and pressing the cards 8, 9. The sidewall 22 faced to the supporting arm 12 of the insulating housing 1 is provided with a plurality of latching holes 221 for engaging with corresponding latching blocks 123 of the insulating housing 1, and the other sidewall 22 faced to the supporting arm 13 is provided with a stand-off 222 for contacting with a grounding pad (not shown) on a circuit board (not shown) for assembling the card connector.

Referring to FIG. 1-3 and FIG. 5, the bottom plate 3 of the shell is assembled to the insulating housing 1 from a bottom face of the insulating housing to define the card receiving space 7 with a inserting port 71 away from the insulating housing 1 together with the top plate 2 and the insulating housing 1. The bottom plate 3 is formed with a first spring 31, a second spring 32 and a third spring 33 respectively extending into the card receiving space 7 from a top surface thereof. The first spring 31 is formed on a side edge near the supporting arm 13; the third spring 33 is formed on the other side edge near the supporting arm 12; and the second spring 32 is formed between and in a rear of the first spring 31 and the third spring 33. A distance between the second spring 32 and the first spring 31 in a transverse direction vertical a card inserting direction is referred as d1, a distance between the second spring 32 and the third spring 33 in the transverse direction is referred as d2, and a distance between the first spring 31 and the third spring 33 in the transverse direction is referred as d3, wherein d3=d1+d2, and d2>d1. Furthermore, the bottom plate 3 has another stand-off 34 for contacting with another grounding pad (not shown) on the circuit board (not shown).

Figure 5:
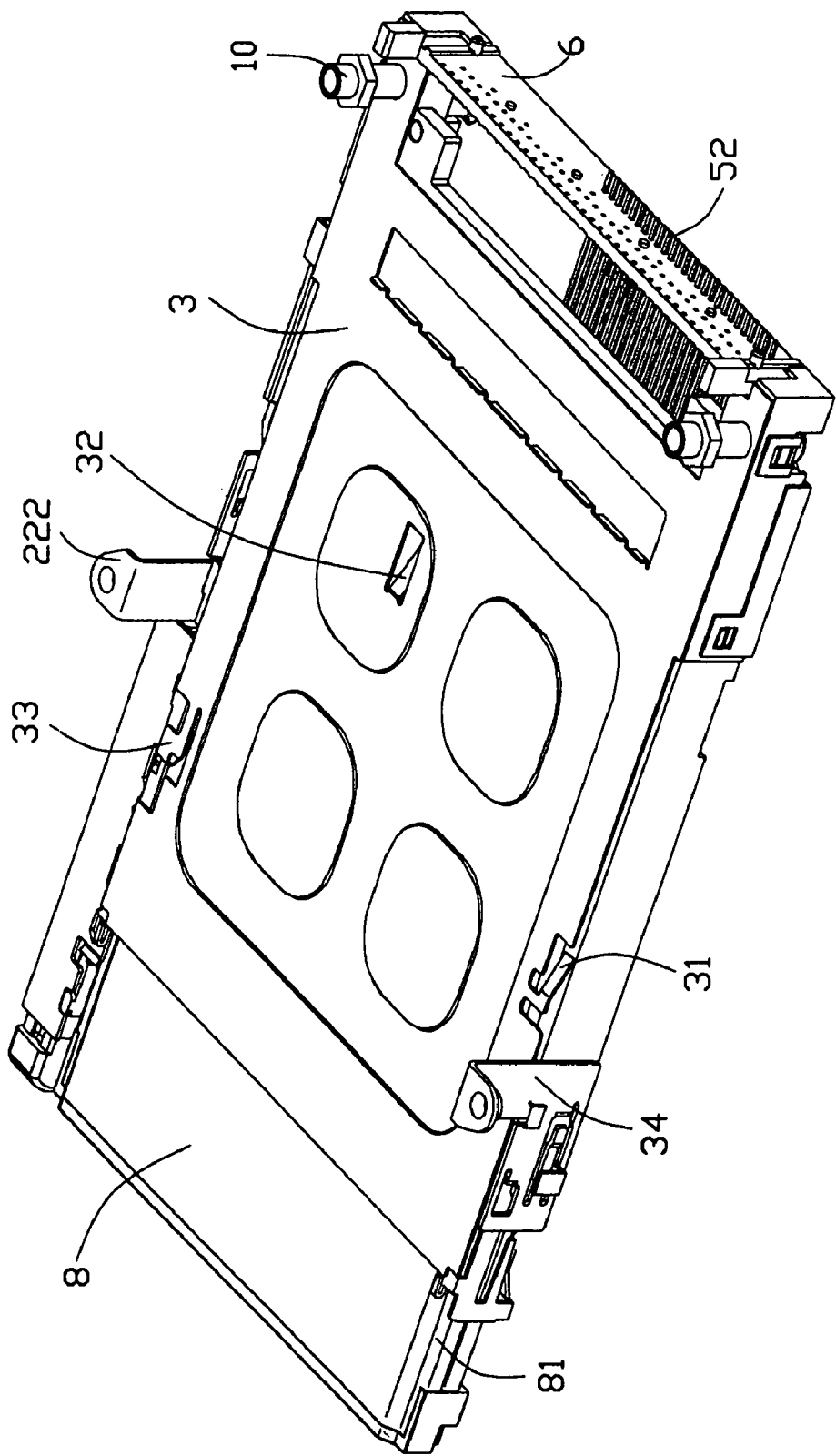
FIG. 5 is similar with the card connector shown in FIG. 2, and an L-shaped card is received in the card connector.
Figure 6:
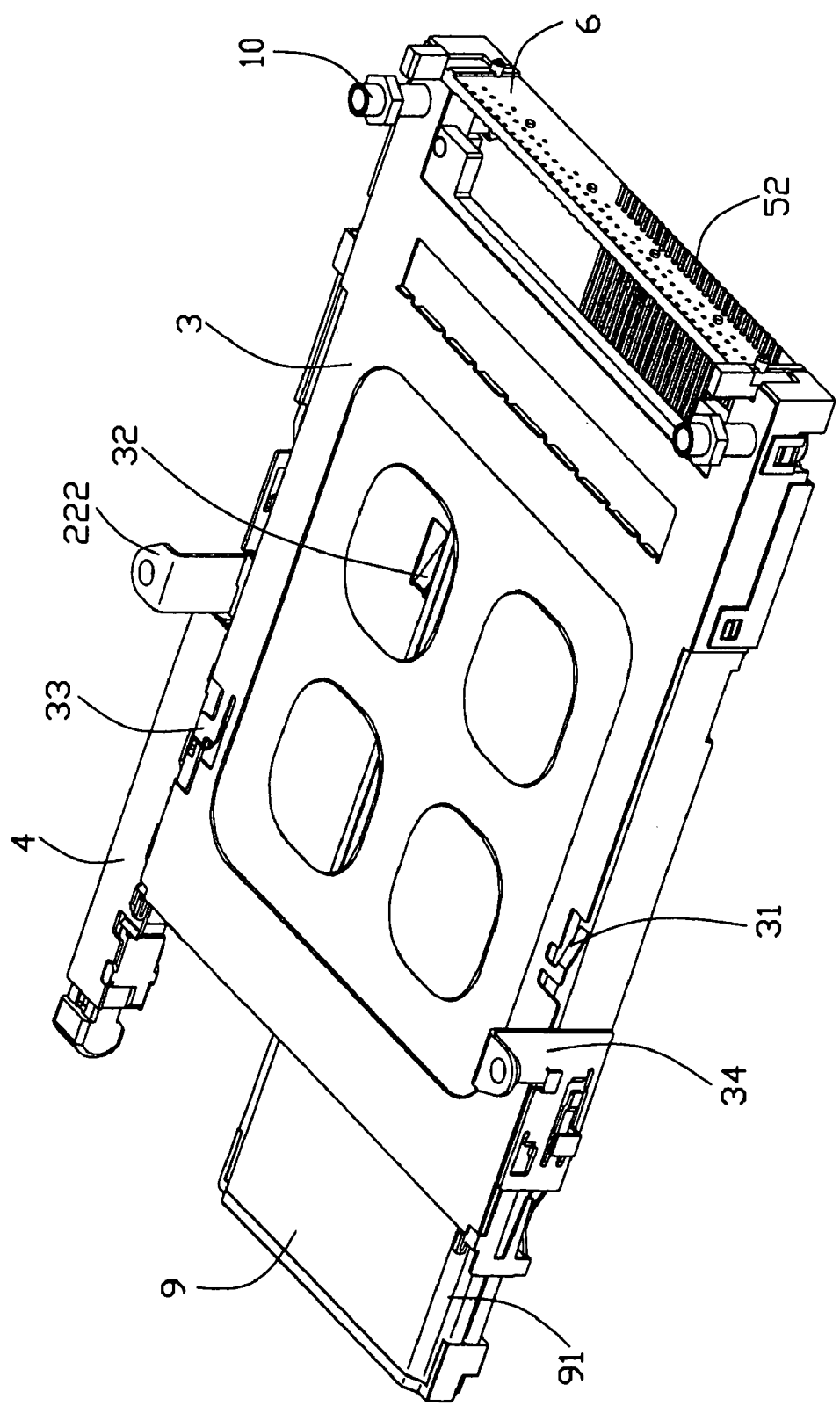
FIG. 6 is similar with the card connector shown in FIG. 2, and a rectangular card is received in the card connector.

Referring to FIG. 3, the first spring 31 has a fixing portion 311, a free end 312 and a contacting portion 313 linking the fixing portion 311 and the free end 312 and protruding into the card receiving space 7 to contact with the cards 8, 9 (referring to FIG. 5 and FIG. 6). The second spring 32 and the third spring 33 have a similar figure with the first spring 31 with fixing portions (not labeled), free ends 322, 332 and contacting portions 323, 333.

Referring to FIG. 1, the ejector 4 comprises a button 41, an push bar 42, a driving bar 43 and an ejecting bar 44, the driving bar 43 is linked with the push bar 42 and the ejecting bar 44 at two opposed ends thereof to be driven by the push bar 42 after pushing the button 41 and bring the ejecting bar 44 rotating to eject the cards 8, 9. Since the ejector 4 is not the invention point of the present invention and a working principle of the ejector 4 is known to all, we do not say more than is needed, here.

Referring to FIG. 4 and FIG. 5, each contact 5 comprises a contacting portion 51, a soldering portion 52 and a linking portion 53 linking the contacting portion 51 and the soldering portion 52. The contacting portions 51 are received in the grooves 1111 of the mating portion 111 of the insulating housing 1 for contacting with the cards 8, 9; the soldering portions 52 are extending out of the insulating housing 1 for soldering to the circuit board; the linking portions 53 are received in the grooves 1111 and extending rearward through the base 11 and toward the spacer 6 assembled to a rear end of the insulating housing 1.

Referring to FIG. 3, FIG. 5 and FIG. 6, the first card 8 is in a L-shape and formed with two step-faces 81 on each lateral edge thereof, a distance between the two step-faces 81 equals d3 so that the first card 8 is able to engage with the first spring 31 and the third spring 33. The second card 9 is a rectangular type and formed with two step-faces 91 on each lateral edge thereof, a distance between the two step-faces 91 equals d1 so that the second card 9 is able to engage with the first spring 31 and the second spring 32.

The first card 8 is inserted into the card receiving space 7 from the inserting port 71 and electrically contacts with the contacting portion 51 of the contacts 5, the contacting portions 313, 333 the first spring 31 and the third spring 33 respectively abut against the step-faces 81 of the first card 8 to achieve an anti-EMI function. Furthermore, the first spring 31 and the third spring 33 press on opposed lateral edges of the first card 8 evenly, which can prevent the first card 8 from inclining in the card receiving space 7 and make sure that the first card 8 contacts with the contacts 5 reliably.

The rectangular second card 9 is inserted into the card receiving space 7 from the inserting port 71 and electrically contacts with the contacts 51, the contacting portions 313, 323 of the first spring 31 and the second spring 32 abut against the step-faces 91 of the second card 9 to achieve an anti-EMI function. Furthermore, the first spring 31 and the second spring 32 press on opposed lateral edges of the second card 9 evenly, which can prevent the second card 9 from inclining in the card receiving space 7 and make sure that the second card 9 contacts with the contacts 5 reliably.

The card connector in accordance with the present invention is formed with the first spring 31, the second spring 32 and the third spring 33 on the bottom plate 3, in manner of the distance between the first spring 31 and the third spring 33 equaling the distance of the step-faces 81 of the first card 8 and the distance between the first spring 31 and the second spring 32 equaling the distance of the step-face 91 of the second card 9. When the first card 8 is inserted into the card receiving space 7, the contacting portions 313, 333 of the first spring 31 and the third spring 33 respectively abut against the step-faces 81 of the first card 8, while the second card 9 is inserted into the card receiving space 7, the contacting portions 313, 323 of the first spring 31 and the second spring 32 respectively abut against the step-faces 91 of the second card 9. So whether the card connector engages with the first card 8 or the second card 9, at least two of the springs 31, 32, 33 abut the cards 8, 9 to ground the EMI signal of the cards 8, 9 and prevent the cards 8, 9 from inclining in the card receiving space 7.

Furthermore, a machining process of the bottom plate 3 is simple relative to the top plate 2, so that the first springs 31, 32, 33 are disposed on the bottom plate 3 to reduces the manufacture cost of the card connector, and the springs 31, 32, 33 can abut against the card 8, 9 reliably in virtue of a deadweight of the cards 8, 9. Simultaneity, the springs 31, 32, 33 may also be disposed on the top plate 2 by being arranged in a same manner with the bottom plate 3.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the board general meaning of the terms in which the appended claims are expressed.

What is claimed is:

1. A card connector for a card comprising:
    an insulating housing formed with a plurality of grooves;
    a plurality of contacts respectively received in the grooves of the insulating housing, each contact having a contacting portion for contacting with the card;
    a shell defining a L-shaped card receiving space for the card together with the insulating housing and comprising a top plate and a bottom plate respectively faced to a top and a bottom surfaces of the insulating housing, the bottom plate formed with a plurality of springs to abut against the card.

2. The card connector as claimed in claim 1, wherein the card receiving space is able to receive a L-shaped card and a rectangular card, at least two of the springs are formed on opposed lateral edges of the bottom plate to engaging with the L-shaped card, and at least one of the springs formed in a central section of the bottom plate and between the two springs to engaging with the rectangular card together with one of the springs in the lateral edges.

3. The card connector as claimed in claim 2, wherein both the L-shaped card and the rectangular card are formed with two step-faces on each lateral edge thereof, respectively, the springs have contacting portions to engaging with the step-faces.

4. The card connector as claimed in claim 3, wherein the insulating housing is formed with a base having a mating portion for engaging with the cards and a pair of supporting arms integral with the base and on opposed ends of the base, each supporting arm has a channel for guiding the cards.

5. The card connector as claimed in claim 4, wherein the top plate and the bottom plate are rectangular shaped and sandwich the insulating housing, the card receiving space for the cards is in a L-shape due to one of the supporting arms of the insulating housing protrudes forwardly from a side of the base.

6. The card connector as claimed in claim 5, wherein the supporting arm protruding from a side of the base integrally has a triangular supporting board extending forwardly toward the card receiving space from a bottom edge thereof.

7. The card connector as claimed in claim 5, further comprising a spacer attached to a rear end of the insulating housing for retaining the contacts.

8. A card connector for a L-shaped card and a rectangular card comprising:
   an insulating housing formed with a plurality of grooves;
   a plurality of contacts respectively received in the grooves of the insulating housing, each contact having a contacting portion for contacting with the card;
   a shell defining a L-shaped card receiving space, which is able to receiving both the L-shaped card and the rectangular card, together with the insulating housing and formed with a plurality of springs to abut against the card.

9. The card connector as claimed in claim 8, wherein at least two of the springs are formed on opposed lateral edges of the shell to engaging with the L-shaped card, and at least one of the springs formed in a central section of the shell between the two springs to engaging with the rectangular card together with one of the springs in the lateral edges.

10. The card connector as claimed in claim 9, wherein both the L-shaped card and the rectangular card are formed with two step-faces on each lateral edge thereof, respectively, the springs have contacting portions to engaging with the step-faces.

11. The card connector as claimed in claim 10, wherein the housing is formed with a base having a mating portion for engaging with the cards and a pair of supporting arms integral with the base and on opposed ends of the base, each supporting arm has a channel for guiding the cards.

12. The card connector as claimed in claim 11, wherein the top plate and the bottom plate are rectangular shape and sandwich the insulating housing, one of the supporting arms of the insulating housing protrudes forwardly from a side of the base to make the card receiving space be L-shaped.

13. The card connector as claimed in claim 12, wherein the supporting arm protruding from a side of the base has a triangular supporting board extending forwardly toward the card receiving space from a bottom edge thereof.

14. A card connector for connecting at least one card, comprising:
   an insulating housing defining a guide rail with a card seating plane thereon;
   a plurality of contacts disposed in the housing, each of said contacts having a contacting portion for contacting with the card;
   a metallic shell, together with the insulating housing, defining a card receiving space for the card, said shell comprising a plate, on which said housing is seated,; wherein
   said plate defines at least one spring extending beyond said seating plane for abutting against the card.

15. The card connector as claimed in claim 14, wherein said spring is deflected in a direction for imposing forces upon a main surface of the card.

16. The card connector as claimed in claim 14, wherein the housing further includes a triangular supporting board unitarily joined with the guide rail.

17. The card connector as claimed in claim 14, wherein the metallic shell is rectangular rather than an L-shaped configuration.

18. The card connector as claimed in claim 14, wherein the card receiving space defines a card insertion direction and at least one of the springs located in front of the other springs along said card insertion direction.

19. The card connector as claimed in claim 14, wherein said plate and said card seating plane are located on a same side of the card receiving space in a vertical direction.

20. The card connector as claimed in claim 14, wherein the card seating plane defines a cutout through which the spring extends from the plate and into the card receiving space.

* * * * *